United States Patent
Noshadi

(10) Patent No.: US 9,516,790 B2
(45) Date of Patent: Dec. 6, 2016

(54) THERMOELECTRIC COOLER/HEATER INTEGRATED IN PRINTED CIRCUIT BOARD

(71) Applicant: Harman Becker Automotive Systems GmbH, Karlsbad (DE)

(72) Inventor: Valod Noshadi, Ettlingen (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 262 days.

(21) Appl. No.: 14/247,870

(22) Filed: Apr. 8, 2014

(65) Prior Publication Data

US 2014/0298825 A1    Oct. 9, 2014

(30) Foreign Application Priority Data

Apr. 9, 2013   (EP) .................... 13 162 954

(51) Int. Cl.
*H05K 7/20* (2006.01)
*H01L 35/32* (2006.01)
*H05K 1/02* (2006.01)
*H05K 1/16* (2006.01)

(52) U.S. Cl.
CPC .............. *H05K 7/205* (2013.01); *H01L 35/32* (2013.01); *H05K 1/0201* (2013.01); *H05K 1/0206* (2013.01); *H05K 1/0209* (2013.01); *H05K 1/16* (2013.01); *H05K 2201/09672* (2013.01); *H05K 2201/10219* (2013.01)

(58) Field of Classification Search
CPC .... H05K 7/205; H05K 1/0201; H05K 1/0206; H05K 1/0209; H05K 2201/09672; H05K 2201/10219

See application file for complete search history.

(56) References Cited

U.S. PATENT DOCUMENTS

| | | |
|---|---|---|
| 5,921,087 A | 7/1999 | Bhatia et al. |
| 7,082,772 B2 | 8/2006 | Welch |
| 7,825,324 B2 | 11/2010 | Hodes et al. |
| 8,188,665 B2 | 5/2012 | Rittner et al. |
| 2006/0237730 A1 | 10/2006 | Abramov |
| 2006/0275608 A1 | 12/2006 | Tonapi et al. |
| 2007/0045804 A1 | 3/2007 | Lin et al. |
| 2007/0077434 A1 | 4/2007 | Clovesko et al. |
| 2009/0153007 A1 | 6/2009 | Jiang |
| 2012/0201008 A1* | 8/2012 | Hershberger ........ H05K 1/0203 361/720 |

FOREIGN PATENT DOCUMENTS

| | | |
|---|---|---|
| DE | 4123870 A1 | 1/1993 |
| DE | 102007063616 A1 | 10/2008 |
| DE | 102007056150 A1 | 5/2009 |
| DE | 102007056151 A1 | 5/2009 |

(Continued)

OTHER PUBLICATIONS

European Search Report for corresponding Application No. 13162954.5, mailed Sep. 18, 2013, 7 pages.

*Primary Examiner* — Emmanuel Duke
(74) *Attorney, Agent, or Firm* — Brooks Kushman P.C.

(57) ABSTRACT

A circuit board is provided that includes at least one Peltier heat pump device with at least one pair of semiconductor members arranged thermally in parallel and electrically in series. The at least one pair of semiconductor members is at least partially embedded in the circuit board.

20 Claims, 7 Drawing Sheets

(56) References Cited

FOREIGN PATENT DOCUMENTS

| | | |
|---|---|---|
| DE | 102008030191 A1 | 1/2010 |
| DE | 102009016154 A1 | 10/2010 |
| DE | 102009045208 A1 | 4/2011 |
| DE | 102009047703 A1 | 6/2011 |
| DE | 102010003365 A1 | 9/2011 |
| DE | 102012100982 A1 | 9/2012 |
| DE | 102011075661 A1 | 10/2012 |
| EP | 1498013 A1 | 1/2005 |
| EP | 1811819 A1 | 7/2007 |
| EP | 2099264 A1 | 9/2009 |
| KR | 101004746 B1 | 1/2011 |

* cited by examiner

US 9,516,790 B2

THERMOELECTRIC COOLER/HEATER INTEGRATED IN PRINTED CIRCUIT BOARD

CROSS-REFERENCE TO RELATED APPLICATIONS

This application claims priority to EP Application No. 13 162 954.5, filed Apr. 9, 2013, the disclosure of which is incorporated in its entirety by reference herein.

TECHNICAL FIELD

The embodiments disclosed herein relate to a circuit board and an electronic component.

BACKGROUND

A thermoelectric element is a device that is able to use electrical energy to pump heat. This effect is known as a Peltier effect and may be used to provide cooling and/or heating depending on the direction of an applied current. A thermoelectric element may also be used in the inverse of this arrangement in which a temperature gradient is used to generate electrical voltage. This effect is known as the Seebeck effect. Various classes of semiconductor materials appropriate for thermoelectric elements are known and include, without limitation, $Bi_2Te_3$, $Bi_{2-x}Sb_xTe_3$, PbTe-PbS-based materials and half-Heusler compounds having a MgAgAs structure.

Peltier heat pumps make use of the Peltier effect to create a heat flux between the junction of two different types of thermoelectric semiconductor materials, for example, a first semiconductor member having a first conductivity type and a second semiconductor member having a second conductivity type which opposes the first conductivity type. The two semiconductor members are arranged in a spatially alternating fashion and are arranged thermally in parallel and electrically in series.

A Peltier heat pump may be used to cool or to heat electronic devices. U.S. Publication No. 2006/0237730 A1 discloses a Peltier cooler integrated with an electronic device in which the Peltier elements are driven by the same current as the cooled electronic device.

Further arrangements of Peltier heat pumps suitable for use with electronic devices are, however, desirable.

SUMMARY

A circuit board is provided that includes at least one Peltier heat pump device. The Peltier heat pump device includes at least one pair of semiconductor members arranged thermally in parallel and electrically in series. The at least one pair of semiconductor members are at least partially embedded in the circuit board.

An electronic component is provided that includes an electronic device, and a circuit board having a major plane and comprising at least one Peltier heat pump device. The Peltier heat pump device includes at least one pair of thermoelectric semiconductor members arranged thermally in parallel and electrically in series, a first cooler/heater surface, and a second heater/cooler surface. The plurality of thermoelectric semiconductor members is at least partially embedded in the circuit board and extends between the first cooler/heater surface and the second heater/cooler surface in the plane of the circuit board. The electronic device is mounted on the first cooler/heater surface.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like reference numerals designate corresponding parts throughout the different views.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
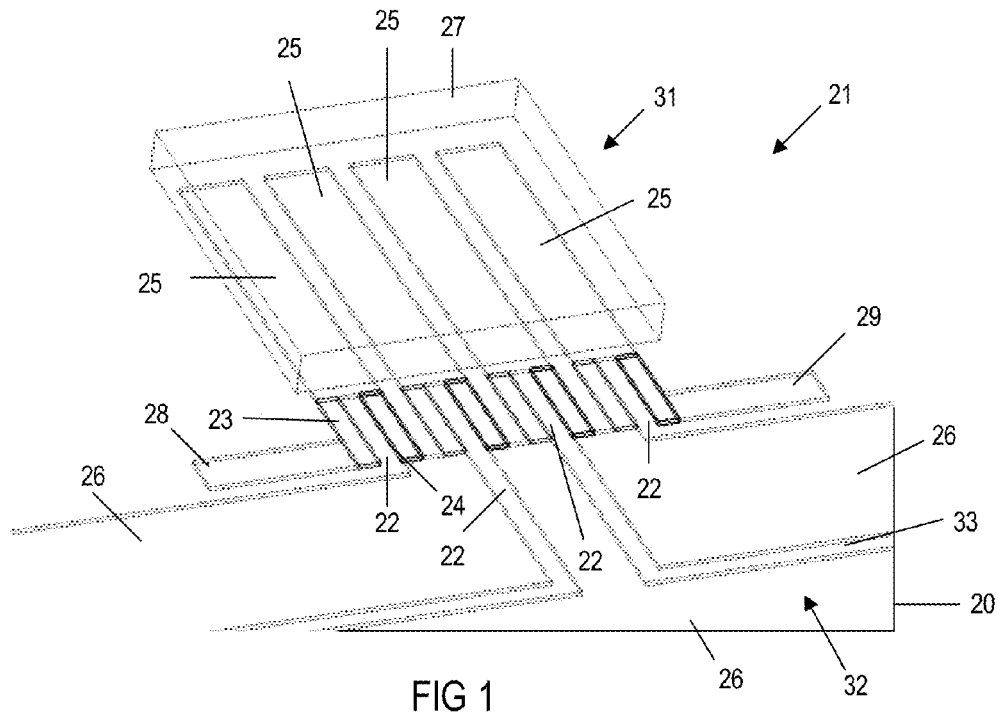
FIG. 1 illustrates a perspective view of a circuit board including a first exemplary Peltier heat pump device.
Figure 2:
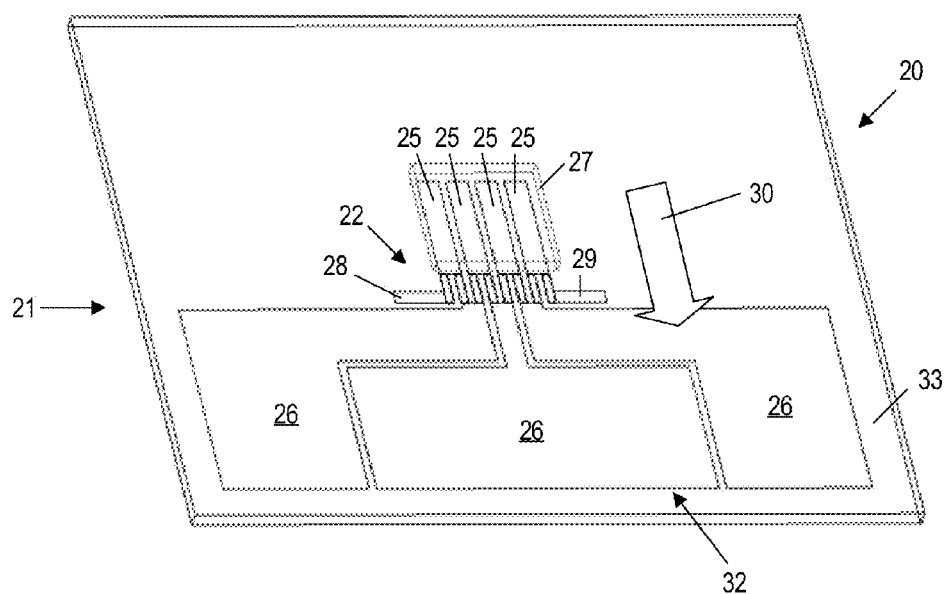
FIG. 2 illustrates a perspective view of the circuit board of FIG. 1.
Figure 3:
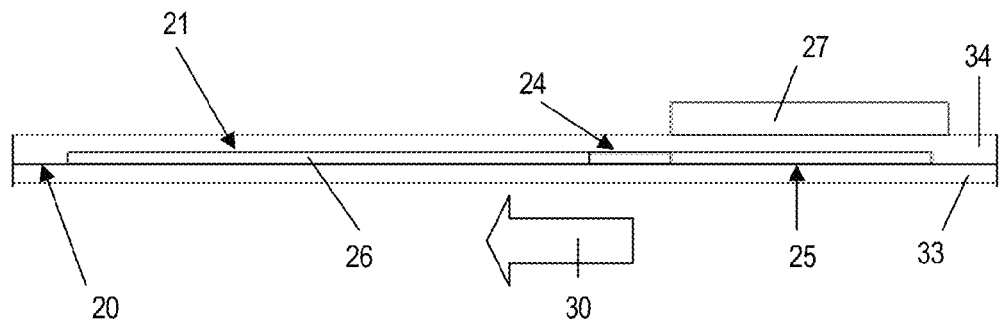
FIG. 3 illustrates a cross-sectional view of the circuit board of FIG. 1.

FIG. 1 illustrates a perspective view of a circuit board 20 including a Peltier heat pump device 21. FIG. 2 illustrates a further perspective view and FIG. 3 illustrates a cross-sectional view of the circuit board 20 and Peltier heat pump device 21 of FIGS. 1 and 2.

The Peltier heat pump device 21 includes a plurality of pairs 22 of semiconductor members. Each pair 22 includes a first semiconductor member 23 of p-type and a second semiconductor member 24 of n-type. Each pair 22 is electrically connected by a first metallic electrode 25. Each semiconductor member 23, 24 of each pair 22 is connected to an adjacent pair 22 of semiconductor members 23, 24 by a second metallic electrode 26 so that the semiconductor members 23, 24 of differing conductivity type are alternately electrically connected in series and the pairs 22 of semiconductor members 23, 24 are thermally connected in parallel. In the illustrated arrangement, the Peltier heat pump device 21 includes four pairs 22 of semiconductor members 23, 24, four first metallic electrodes 25 and three second metallic electrodes 26. The semiconductor members 23, 24 display a thermoelectric effect.

The first metallic electrodes 25 together provide a first cooler/heater surface 31 for cooling or heating an electronic device 27, such as a semiconductor chip or semiconductor chip package, which is mounted on these first metallic electrodes 25. The term "cooler/heater" is used herein to describe a surface which is able to provide cooling or heating depending on the direction of heat transfer. The second metallic electrodes 26 together provide a second heater/cooler surface 32 which is arranged laterally adjacent to the electronic device 27, as is illustrated in FIGS. 2 and 3.

The Peltier device 21 has two contacts 28, 29. A current is supplied to the contacts 28, 29 of the Peltier heat pump device 21 in order to produce a temperature gradient and a heat transfer between the first metallic electrodes 25 and the second metallic electrodes 26.

The direction of the current applied to the Peltier heat pump device 21 may be selected so that the first metallic electrodes 25 provide cooling for the electronic device 27 and the second metallic electrodes 26 provide a hot surface for dissipating heat removed from the electronic device 27. In the arrangement illustrated in FIGS. 2 and 3, the Peltier heat pump device 21 is used to cool the electronic device 27. The direction of heat transfer is indicated in FIG. 2 by arrow 30. Alternatively, Peltier heat pump device 21 may provide heating to the electronic device 27 via the first metallic electrodes 25 by reversing the direction of current applied to the contacts 28, 29.

The first metallic electrodes 25, the second metallic electrodes 26 and the semiconductor members 23, 24 providing the Peltier heat pump device 21 are generally coplanar and are arranged within the circuit board 20. In the case of cooling, heat is transferred in the plane of the circuit board 20 from the electronic device 27 via the first metallic electrodes 25, the semiconductor members 23, 24 to the second metallic electrodes 26 which serve as a heat spreading surface.

The electronic device 27 may be a semiconductor chip, a semiconductor package or a device such as a digital micromirror device (DMD) chip. In the drawings, only a single electronic device is illustrated as mounted on the circuit board. However, further devices may be mounted on the circuit board which may or may not also be cooled and/or heated using the Peltier heat pump device 21 or by one or more further Peltier heat pump devices.

The circuit board 20 may be produced by laminating metallic layers, for example copper foils, to form the first metallic electrodes 25 and the second metallic electrodes 26 and strips of appropriately doped semiconductor material to form the semiconductor members 23, 24 onto a substrate layer 33 of the circuit board 20. The substrate layer 33 of the circuit board 20 may comprise a dielectric material, for example a dielectric material that is typically used for the production of circuit boards or printed circuit boards.

Portions of the first metallic electrodes 25, the second metallic electrodes 26 and the semiconductor members 23, 24 of the Peltier heat pump device 21 may be covered by a further dielectric layer 34 to provide protection from the environment and electrical insulation. Regions of the first metallic electrodes 25 and second metallic electrodes 26 may, however, be left exposed in the circuit board 20 in order to improve the transfer of heat from, or to, the electronic device 27 and from, or to, the environment, respectively.

In exemplary arrangements in which portions of the first metallic electrodes 25 and the second metallic electrodes 26 are partially exposed from the circuit board 20, they may be described as being partially embedded within the circuit board 20. In exemplary arrangements in which no portion of the first metallic electrodes 25 and the second metallic electrodes 26 is partially exposed from the circuit board 20, they may be described as being entirely embedded within the circuit board 20.

The Peltier heat pump device 21 provides a thermoelectric cooler/heater which is embedded within the thickness of the circuit board 20 in order to enable heat to be pumped and transferred in the plane of the circuit board 20. The thin semiconductor stripes 23, 24 of the semiconductor members have relatively small cross-section which reduces unwanted heat transfer in the reverse direction of the pumped heat. The use of copper foils, in particular in regions adjacent the heat generating electronic device 27, enables heat to be dissipated away from the electronic device 27 more effectively. Additionally, as the components of the Peltier heat pump device 21 are embedded within the circuit board 20, they are less prone to damage caused by vibration and shocks. The electronic device 27 may be mounted onto the first metallic electrodes 25 which provide a first cooler/heater surface 31 by, for example, a layer of adhesive. Therefore, the packaging of the Peltier heat pump device 21 is simplified.

The lateral area of the second metallic electrodes 26 which provides the second heater/cooler surface 32 may be much larger than that of the electronic device 27 in order to improve heat transfer from the second metallic electrodes 26 to and from the environment.

In the exemplary arrangements illustrated in FIGS. 1 to 3, the outer two second metallic electrodes 26 have a general L-shape that surrounds three sides of a third second metallic electrode 26. The first metallic electrodes 25 have a general rectangular form and a lateral extent which is approximately that of the lateral area of the electronic device 27. The individual first metallic electrodes 25 and the individual second metallic electrodes 26 may be electrically insulated from one another by regions of the underlying dielectric substrate 33 and by intervening and/or overlying dielectric layers.

Electronic devices commonly have a temperature range over which they operate most efficiently. Commonly, it is desired to actively cool electronic devices to prevent them from becoming too hot. However, in some applications, for example, those in which the electronic device is in contact with the environment, it may be desirable to actively warm up the electronic device in order that it reach its minimum operating temperature more quickly. This may be useful in applications such as automobiles which the electronic devices may be subjected to low temperatures, for example, temperatures of less than 0° C. After the electronic device has reached its minimum operating temperature, the current applied to the Peltier heat pump device may be switched off to stop active heating. In the case that the electronic device subsequently nears its maximum operating temperature, the current applied to the Peltier heat pump device may be reversed in order to actively cool the electronic device.

Figure 4:
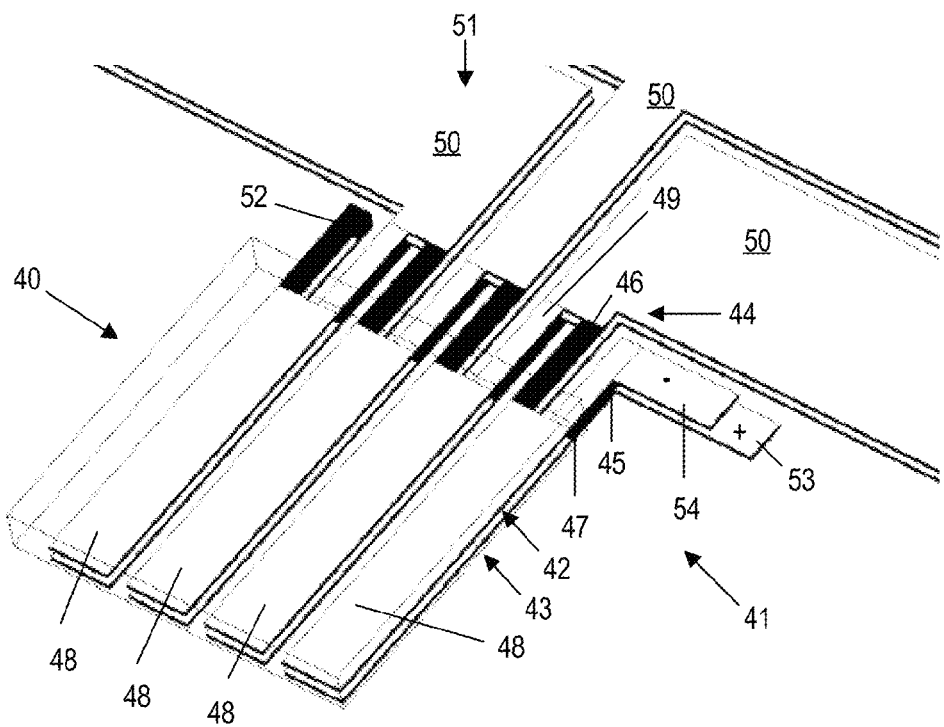
FIG. 4 illustrates a circuit board including a second exemplary Peltier heat pump device.
Figure 5:
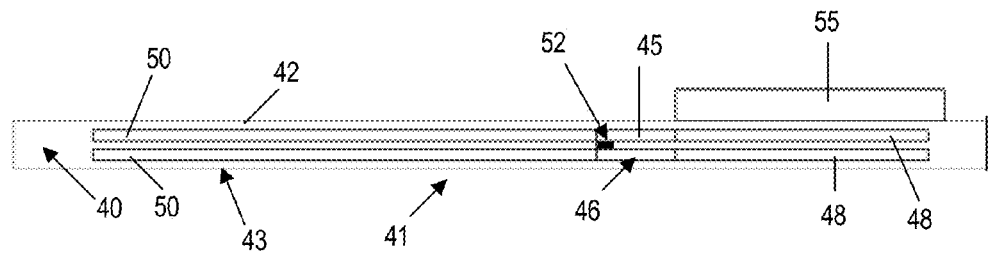
FIG. 5 illustrates a cross-sectional view of the circuit board of FIG. 4.

FIG. 4 illustrates a second exemplary circuit board 40 including a Peltier heat pump device 41. FIG. 5 illustrates a cross-sectional view of the circuit board 40 of FIG. 4.

The Peltier heat pump device 41 includes two layers 42, 43, both of which are embedded within the thickness of the circuit board 40. The layer 42 is positioned above the layer 43. Each of the layers 42, 43 includes a plurality of pairs 44 of semiconductor members 45, 46 which are connected at one end 47 to first cooler/heater layers 48 and, at the opposing end 49, adjacent pairs 44 are electrically connected in series by a second metallic layer 50 which provides a second heater/cooler surface 51. Each of the layers 42, 43 includes first cooler/heater layers and second heater/cooler layers. The first cooler/heater layers 48, second heater/cooler layers 50 and semiconductor members 45, 46 of each layer 42, 43 are coplanar.

The two layers 42, 43 may be electrically insulated from one another by an intermediate dielectric layer which is positioned between the layers 42, 43. The semiconductor members 45, 46 of the two layers 42, 43 are electrically connected in series by an electrically conductive via 52 which extends through the intermediate dielectric layer between the endmost semiconductor members of the upper layer 42 and the lower layer 43. The two contacts 53, 54 for supplying current to the semiconductor members 45, 46 are positioned one above each other in the two layers 42, 43. The two layers 42, 43, (or even more layers) may used to increase the cooling and/or heating capacity of the Peltier heat pump device 41 for cooling and/or heating an electronic device 55 mounted above the first cooler/heater layers 48. However, the number of the layers of the Peltier heat pump device is not limited to two.

Figure 6:
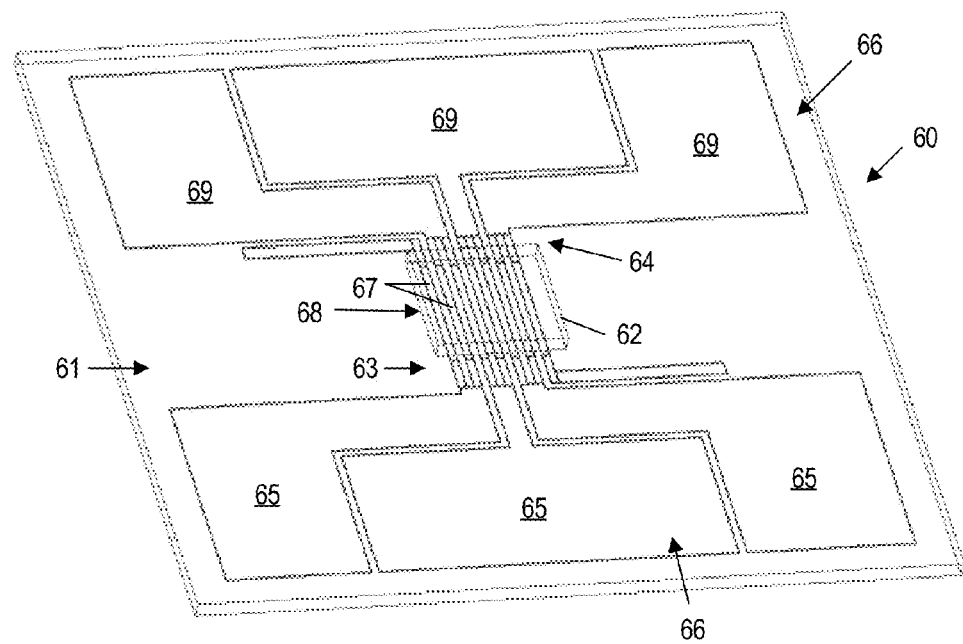
FIG. 6 illustrates a circuit board including a third exemplary Peltier heat pump device.

FIG. 6 illustrates a third exemplary circuit board 60 comprising a Peltier heat pump device 61. The Peltier device 61 extends on two opposing sides of the electronic device 62. The Peltier heat pump device 61 includes two rows 63, 64 of strip-like semiconductor members. Each row 63, 64 of strip-like semiconductor members is positioned on an opposing side of the electronic device 62. One end of a pair of the thermoelectric elements of the row 63 is electrically connected in series to a second metallic electrode 65 which provides a second heater/cooler surface 66 adjacent to the electronic device 62.

The other end of each of the thermoelectric semiconductor elements of the pair is electrically connected to a different first metallic electrode 67 providing a first cooler/heater surface 68. Each first metallic electrode 67 is strip-like and electrically connected to a semiconductor member of the opposing conductivity of the opposing row 64 of semiconductor members. The semiconductor members of the second row 64 are also electrically connected together to a second metallic electrode 69 on the opposing side of the electronic device 62 which provides a second heater/cooler surface 66. The strip-like first metallic electrodes 67 have a length and an arrangement such that an area is covered which corresponds to the area of the electronic device 62. The first metallic electrodes 67 provide the first cooler/heater surface 68 which is in thermal contact with the electronic device 62 which is to be cooled and/or heated by the Peltier heat pump device 61.

The two rows 63, 64 of semiconductor members are connected in series by the first metallic electrodes 67 so that one of the contacts for supplying current to the Peltier heat pump device 61 is connected to each row 63, 64. The two rows 63, 64 of semiconductor members, first metallic electrodes 67, second metallic electrode 65 and second metallic electrode 69 are coplanar and arranged in a common plane within the thickness of the circuit board 60.

Figure 7:
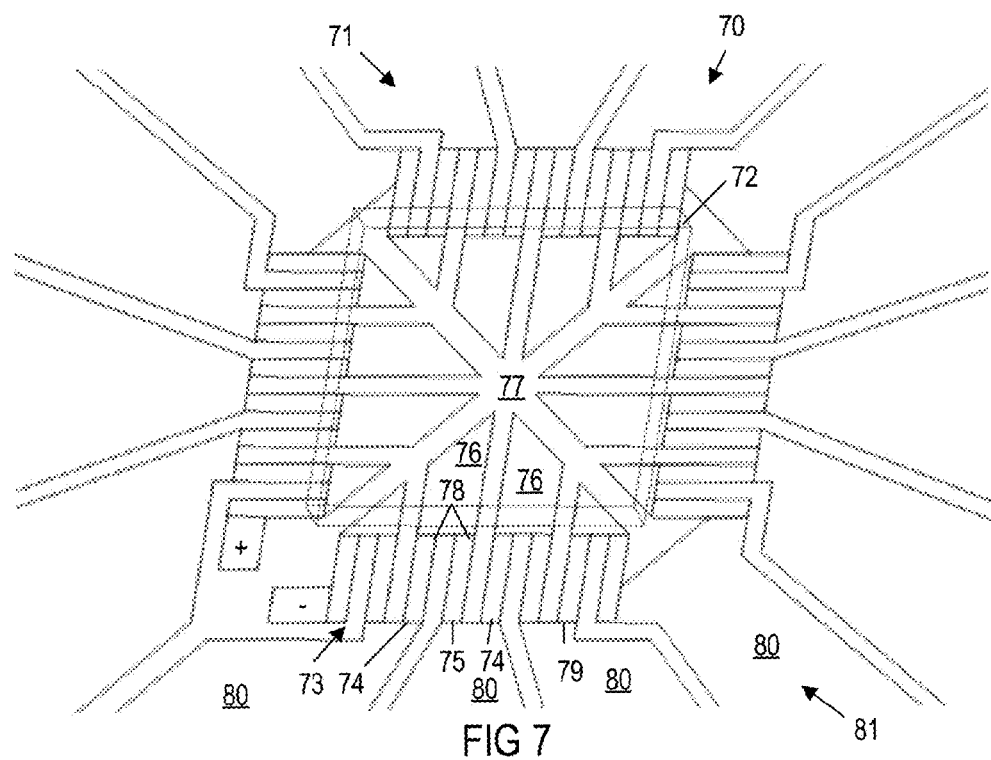
FIG. 7 illustrates a circuit board including a fourth exemplary Peltier heat pump device.

FIG. 7 illustrates a fourth exemplary circuit board 70 including a Peltier heat pump device 71 which extends on all four sides of an electronic device 72 which is to be cooled and/or heated. Pairs 73 of semiconductor members 74, 75 of opposite conductive type are arranged on all four sides of the electronic device 72. First ends 78 of the pairs 73 of semiconductor members 74, 75 are connected to first metallic electrodes 76 which electrically connect each pair to one another. The first metallic electrodes 76 extend toward one another to form a generally square area and provide the first cooler/heater surface 77 which is in thermal contact with the electronic device 72 to be cooled and/or heated.

The opposing ends 79 of a pair 73 of semiconductor members 74, 75 are connected to differing second metallic electrodes 80 which provide second heater/cooler surfaces 81. The second metallic electrodes 80 extend outwardly on all four sides of the electronic device 72.

The first metallic electrodes 76, semiconductor members 74, 75 and the second metallic electrodes 80 forming the Peltier heat pump device 71 are embedded within the circuit board 70 in a common plane. The Peltier heat pump device 71 enables heat transfer in the plane of the circuit board 70 on all four sides of the electronic device 72. In cases using the Peltier heat pump device 71 as a cooling element, heat can be dissipated from the second heater surfaces 81 on all four sides of the electronic device 72.

Figure 8:
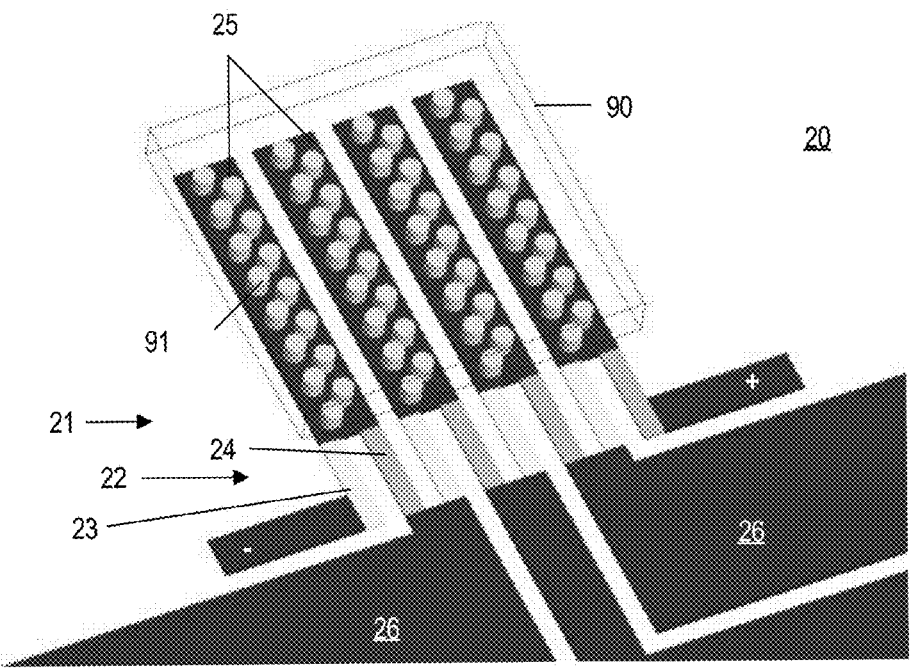
FIG. 8 illustrates a circuit board including a fifth exemplary Peltier heat pump device.
Figure 9:
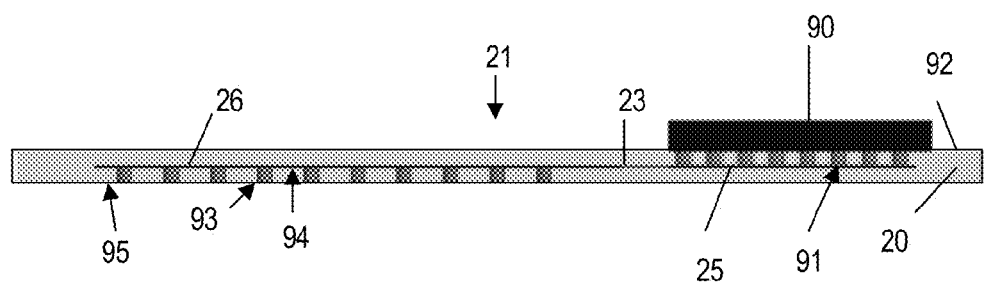
FIG. 9 illustrates a cross-sectional view of the circuit board FIG. 8.

FIG. 8 illustrates a perspective view and FIG. 9 illustrates a cross-sectional view of an electronic device 90 mounted on a printed circuit board 20 and Peltier heat pump device 21 according to the arrangement illustrated in FIGS. 1 to 3. The Peltier heat pump device 21 is positioned in a plane within the circuit board 20. Thermally conductive vias 91 are provided which extend between the upper surface of the first metallic electrodes 25 within the circuit board 20 and the upper surface 92 of the circuit board 20 in the region in which the electronic device 90 is positioned. The thermally conductive vias 91 may be in direct physical contact with the electronic device 90. Alternatively, there may be a layer of an electrically insulating material such as a dielectric adhesive positioned between the electronic device 90 and the thermally conductive vias 91. The thermally conductive vias 91 may be used to further increase heat transfer between the electronic device 90 and the Peltier heat pump device 21.

A second plurality of thermally conductive vias 93 is provided which extends from the lowermost surface 94 of the second metallic electrodes 26 to the lower surface 95 of the circuit board 20. This second plurality of thermally conductive vias 93 may be used to increase the heat dissipation from the second metallic electrodes 26 to the environment in the case that the electronic device 90 is actively cooled using the Peltier heat pump device 21 within the circuit board 20.

Figure 10:
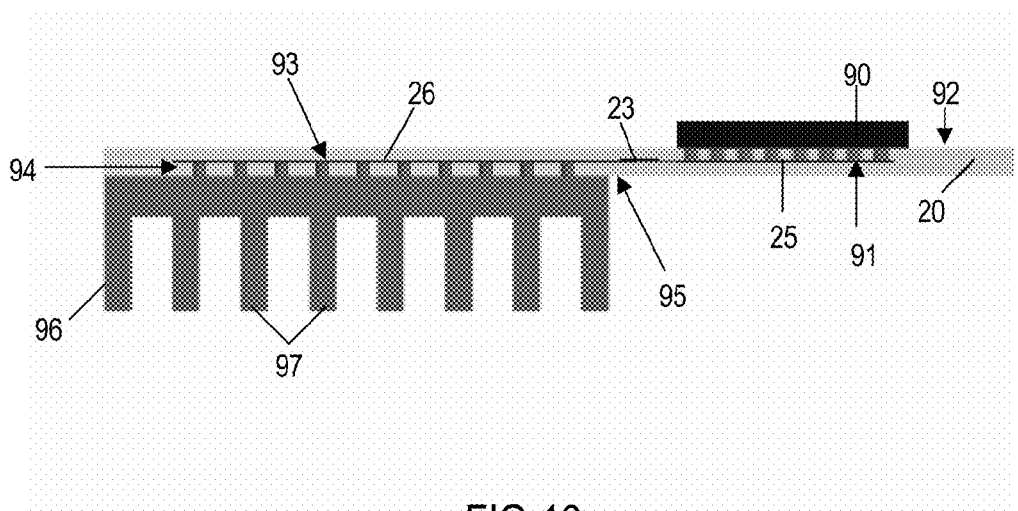
FIG. 10 illustrates a cross-sectional view of the circuit board of FIG. 9 further including a heat sink.

FIG. 10 illustrates a further exemplary arrangement, in which a heat sink 96 is attached to the lower surface 95 of the circuit board 20 in the region of the second metallic electrodes 26. The heat sink 96 is in direct physical contact with the second plurality of thermally conductive vias 93 and further increases heat dissipation from the second metallic electrodes 26. The heat sink 96 may be a metal such as copper and may include a plurality of protruding fins 97 which further increase heat dissipation into the environment.

In the exemplary arrangements described above, the electronic device is mounted on an upper planar surface of the circuit board. In further exemplary arrangements, the electronic device which is to be cooled and/or heated may be positioned with differing arrangements relative to the first cooler/heater surface of the Peltier heat pump device.

Figure 11:
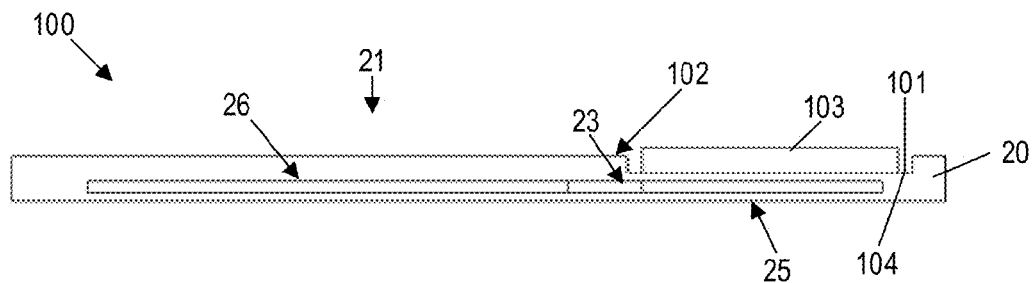
FIG. 11 illustrates another electronic component including a circuit board and a Peltier heat pump device.

FIG. 11 illustrates an electronic component 100 which includes a circuit board 20 with a Peltier heat pump device 21 according to the exemplary illustrated in FIGS. 1 to 3. The electronic component 100 differs from that of the exemplary arrangement illustrated in FIGS. 1 to 3 in that the circuit board 20 includes a cavity 101 in its upper surface 102 for accommodating an electronic device 103 such as a semiconductor chip or a packaged semiconductor chip. The plurality of first cooler/heater surfaces 25, the semiconductor members 23, 24 and the plurality of second heater/cooler surfaces 26 are embedded within the circuit board 20 in a common plane. The first cooler/heater surfaces 25 are positioned underneath the lower surface of the electronic device 103.

The electronic device 103 is positioned within the cavity 101 in the upper surface 102 of circuit board 20 such that at least a portion of its height is surrounded by portions of the circuit board 20 defining the cavity 101. This arrangement may be used to decrease the overall height of the electronic component 100 including the electronic device 103 and circuit board 20 over an arrangement in which electronic device 103 is positioned on a planar upper surface of circuit board 20. This arrangement may also be used to decrease the length of the thermal path between the electronic device 103 and the first cooler/heater surfaces 25. The first cooler/heater surfaces 25 may form portions of the base 104 of the cavity 101. Alternatively, the first cooler/heater surfaces 25 may be positioned underneath the base 104 of the cavity 101.

Figure 12:
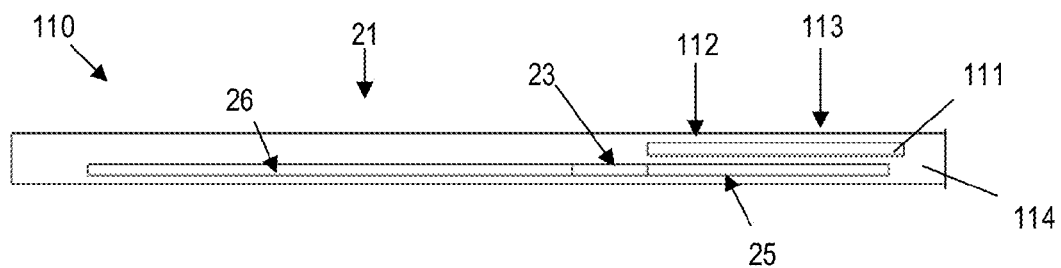
FIG. 12 illustrates still another electronic component including a circuit board and a Peltier heat pump device.

FIG. 12 illustrates an exemplary electronic component 110 which includes a circuit board 20 and a Peltier heat pump device 21 according to the arrangement illustrated in FIGS. 1 to 3. In the present component, the Peltier heat pump device 21 and an electronic device 111, such as a semiconductor chip or semi-conductor package, is embedded entirely within the circuit board 20. The electronic device 111 is mounted on the first cooler/heater surface 25 of the Peltier heat pump device 21 and has a thickness relative to the thickness of the circuit board 20 such that the upper surface 112 of the electronic device 111 is positioned below the upper surface 113 of circuit board 20. The circuit board 20 may include a cavity positioned above the first cooler/heater surface 25 in which the electronic device 111 is mounted. The cavity may have a depth such that the electronic device 111 is accommodated within the cavity. The edges of the electronic device 111 may be encapsulated by applying a resin or adhesive in the remaining volume of the cavity.

The upper surface 112 of the electronic device 111 may be covered with a further layer 114 forming the multilayer or laminate circuit board 20 so that the electronic device 111 is embedded entirely within the volume of the circuit board 20. This arrangement may be useful for thin electronic devices or thin semiconductor chips in order to decrease the overall height of the electronic component. This arrangement may also be useful in providing extra protection for the electronic device as it is mechanically protected by the surrounding circuit board and is also protected from the environment.

Figure 13:
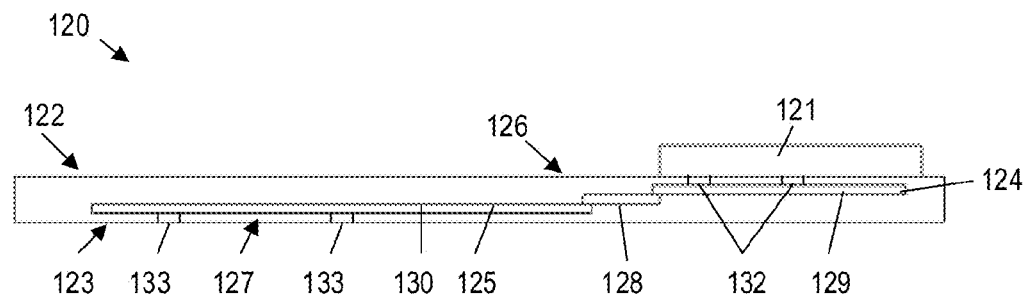
FIG. 13 illustrates still another electronic component including a circuit board and a Peltier heat pump device.

FIG. 13 illustrates an exemplary electronic component 120 including an electronic device 121, a multilayer circuit board 122 and a Peltier heat pump device 123 embedded in the multilayer circuit board 122. The Peltier heat pump device 123 differs from that illustrated in FIGS. 1 to 3 in that the first cooler/heater surface 124 and the second heater/cooler surface 125 lie in different planes within the thickness of the multilayer circuit board 122 and are spaced at a distance from one another. The first cooler/heater surface 124 is positioned towards the top surface 126 of the multilayer circuit board 122 and the second heater/cooler surface 125 is positioned towards the opposing lower side 127 of the multilayer circuit board 122. The first cooler/heater surface 124 is positioned directly underneath the electronic device 121 which is to be cooled and/or heated and the second heater/cooler surface 125 is positioned adjacent and laterally spaced at a distance from the first cooler/heater surface 124.

The first cooler/heater surface 124 is thermally and electrically connected to the second heater/cooler surface 125 by a plurality of semiconductor members 128 which extend between, and are in contact with, the first cooler/heater surface 124 and the second heater/cooler surface 125. The semiconductor members are positioned in a third plane which is positioned between the plane including the first cooler/heater surface 124 and the plane including the second heater/cooler surface 125. The semiconductor members 128 have a thickness such that they bridge the space between the first cooler/heater surface 124 and the second heater/cooler surface 125.

The general arrangement of the connections between the first cooler/heater surface 124, the semiconductor members 128 and the second heater/cooler surface 125 may correspond to that illustrated in one of FIGS. 1 to 3. In particular, the Peltier heat pump device 123 includes a plurality of first metallic electrodes 129 which provide the first cooler/heater surface 124, a plurality of second metallic electrodes 130 which provide the second heater/cooler surface and a plurality of pairs of semiconductor members 128, of which only one is illustrated in the cross-sectional view of FIG. 13. Each pair of semiconductor members 128 includes a first semiconductor member of p-type and a second semiconductor member of n-type. Each pair is electrically connected by a first metallic electrode 130. Each semiconductor member of each pair is connected to an adjacent pair of semiconductor members by a second metallic electrode 130 so that the semiconductor members of differing conductivity type are alternately electrically connected in series and the pairs of semiconductor members are thermally connected in parallel.

In the exemplary embodiment illustrated in FIG. 13, the first cooler/heater surface 124 and the second heater/cooler surface 125 are positioned within the body of the multilayer circuit board 122. A first plurality of thermally conductive vias 132 is provided which extends between the first cooler/heater surface 124 and the electronic device 121 and a second plurality of thermally conductive vias 133 extends between the lower surface of the second heater/cooler surface 125 and the outermost lower surface 127 of the multilayer circuit board 122. However, in further non-illustrated exemplary embodiments, the first plurality of vias 132 and/or the second plurality of vias 133 may be omitted and/or the first cooler/heater surface 124 and the second heater/cooler surface may be exposed from the multilayer circuit board 122.

Figure 14:
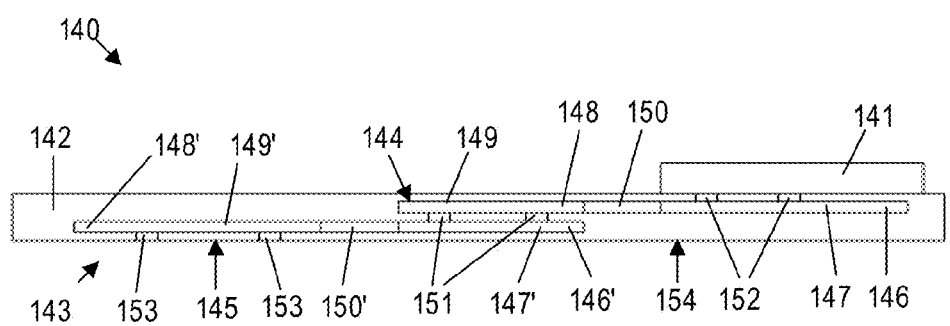
FIG. 14 illustrates still another electronic component including a circuit board and a Peltier heat pump device.

FIG. 14 illustrates an exemplary electronic component 140 including an electronic component 141, a multilayer circuit board 142 and a Peltier heat pump device 143.

The Peltier heat pump device 143 comprises two layers 144, 145 which are positioned in different planes within the multilayer circuit board 142. Each of the layers 144, 145 includes a structure which itself provides a Peltier heat pump device. Each layer 144, 145 includes a first cooler/heater surface 146, 146' comprising a plurality of first metallic electrodes 147, 147', a second heater/cooler surface 148, 148' comprising a plurality of second metallic electrodes 149, 149' which are thermally and electrically connected to one another by a plurality of semiconductor elements 150, 150' which are arranged coplanar with one another. Each layer 144, 145 has an arrangement similar to that illustrated in FIGS. 1 to 3. The second layer 145 extends laterally away from the first layer 144 and the electronic component 141.

The first layer 144 is positioned above the second layer 145 such that the plurality of second metallic electrodes 149 of the first layer are positioned directly above the plurality of first metallic electrodes 147' of the second layer 145. The plurality of second metallic electrodes 149 are thermally connected to the plurality of first metallic electrodes 147' of the second layer 145. In the illustrated exemplary embodiment, the thermal connection includes a plurality of thermal vias 151 which extend between the plurality of second metallic electrodes 149 and the plurality of first metallic electrodes 147' to reduce the thermal resistance.

In the exemplary embodiment illustrated in FIG. 14, the first layer 144 and the second layer 145 of the Peltier heat pump device 143 are embedded within the thickness of the multilayer circuit board 142. A first plurality of thermally conductive vias 152 is positioned between the electronic component 141 and the first cooler/heater surface 146 of the first layer 144 and a second plurality of thermally conductive vias 153 is positioned between the second heater/cooler surface 148' of the lower layer 145 and the lower surface 154 of the multilayer printed circuit board 142. In further non illustrated exemplary embodiments, the first cooler/heater surface 146 of the upper layer 144 and the second heater/cooler surface 148' of the lower layer 145 are exposed from the multi-layer circuit board 142. In this embodiment, the thermally conductive vias 152 and 153 may be omitted. Of course, the number of layers is not limited to two and can be any number greater than two.

Accordingly, an electronic component may include an electronic device and a circuit board having a major plane and include at least one Peltier heat pump device. The Peltier heat pump device may include at least one pair of thermoelectric semiconductor members arranged thermally in parallel and electrically in series; a first cooler/heater surface, and a second heater/cooler surface. The plurality of semiconductor members may be at least partially embedded in the circuit board and extend between the first cooler/heater surface, and the second heater/cooler surface in the plane of the circuit board, wherein the electronic device being mounted on the first cooler/heater surface.

The electronic device may be embedded at least partially within the circuit board. The electronic component may further include at least one of a heat sink mounted on the second heater/cooler surface, and a power supply for the Peltier heat pump. The electronic device may be a digital micro-mirror device.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A circuit board, comprising at least one Peltier heat pump device, the Peltier heat pump device comprising at least one pair of thermoelectric semiconductor members arranged thermally in parallel and electrically in series, the at least one pair of thermoelectric semiconductor members being at least partially embedded in the circuit board.

2. The circuit board of claim 1, wherein the Peltier heat pump device further comprises at least one first cooler/heater surface and at least one second heater/cooler surface, each pair of thermoelectric semiconductor members extending between a common first cooler/heater surface and a different second heater/cooler surface.

3. The circuit board of claim 2, wherein at least one of the at least one of first cooler/heater surface and the at least one of the second heater/cooler surface is at least partially embedded in the circuit board.

4. The circuit board of claim 2, wherein the first cooler/heater surface is arranged laterally adjacent the at least one second heater/cooler surface.

5. The circuit board of claim 1, wherein the Peltier heat pump device further comprises at least one first cooler/heater surface and at least one second heater/cooler surface, the at least one first cooler/heater surface, and wherein the at least one second heater/cooler surface, and the at least one pair of thermoelectric semiconductor members are generally coplanar and arranged within the circuit board.

6. The circuit board of claim 1, wherein each pair of thermoelectric semiconductor members comprises a first semiconductor member of a first conductivity type and a second semiconductor member of a second conductivity type which opposes the first conductivity type.

7. The circuit board of claim 6, wherein a first metallic electrode extends between the first semiconductor member and the second semiconductor member and provides one of a cooler surface and a heater surface.

8. The circuit board of claim 6, wherein adjacent pairs of thermoelectric semiconductor members are electrically connected to one another by a second metallic electrode which extends between semiconductor members of differing conductivity type of adjacent pairs of thermoelectric semiconductor elements.

9. The circuit board of claim 8, wherein the second metallic electrode extends laterally from the semiconductor members and provides a heat dissipation surface.

10. The circuit board of claim 6, wherein the first thermoelectric member is arranged above the second thermoelectric member and is electrically connected to the second thermoelectric member by at least one via.

11. The circuit board of claim 1, wherein the Peltier heat pump device further comprises at least one of:
a first cooler/heater surface embedded within the circuit board and a plurality of thermally conductive vias that extends from the first cooler/heater surface to an electronic device which is to be cooled and/or heated; and
a second heater/cooler surface embedded within the circuit board and a plurality of thermally conductive vias extends from the second heater/cooler surface to an outer surface of the circuit board.

12. The circuit board of claim 11, wherein copper layers available in the circuit board serve as the first cooler/heater surface and the second heater/cooler surface.

13. The circuit board of claim 11, wherein the first cooler/heater surface and the second heater/cooler surface further provide at least one electrode electrically connected to the at least one pair of thermoelectric semiconductor members.

14. The circuit board of claim 11, wherein the Peltier heat pump device further comprises at least one first cooler/heater surface and at least one second heater/cooler surface, the at least one first cooler/heater surface being arranged in a first plane, the at least one second heater/cooler surface being arranged in a second plane spaced at a distance from the first plane, and the at least one pair of thermoelectric semiconductor members extending between the at least one first cooler/heater surface in the first plane and the at least one second heater/cooler surface in the second plane.

15. The circuit board of claim 1, wherein the Peltier heat pump device comprises at least two layers, wherein each layer comprises at least one first cooler/heater surface and at least one second heater/cooler surface, and wherein the at least one first cooler/heater surface, the at least one second heater/cooler surface, and the at least one pair of semiconductor members are generally coplanar and arranged within the circuit board.

16. A circuit board, comprising at least one Peltier heat pump device, the Peltier heat pump device comprising at least one pair of thermoelectric semiconductor members arranged thermally in parallel and electrically in series, the at least one pair of thermoelectric semiconductor members being at least partially embedded in the circuit board, wherein each pair of thermoelectric semiconductor members comprise a first semiconductor member and a second semiconductor member and wherein a first metallic electrode extends between the first semiconductor member and the second semiconductor member.

17. The circuit board of claim 16 wherein the first semiconductor member is of a first conductivity type and the second semiconductor is of a second conductivity type which opposes the first conductivity type.

18. The circuit board of claim 16 wherein the first metallic electrode extends between the first semiconductor member and the second semiconductor member to provide one of a cooler surface and a heater surface.

19. The circuit board of claim 16 wherein adjacent pairs of thermoelectric semiconductor members are electrically connected to one another by a second metallic electrode which extends between semiconductor members of differing conductivity type of adjacent pairs of semiconductor elements.

20. A circuit board, comprising at least one Peltier heat pump device, the Peltier heat pump device comprising at least one pair of thermoelectric semiconductor members arranged thermally in parallel and electrically in series, at least one first cooler/heater surface and at least one second heater/cooler surface, wherein the at least one first cooler/heater surface and the at least one second heater/cooler surface is at least partially embedded in the circuit board.

* * * * *